(12) United States Patent
Chang et al.

(10) Patent No.: US 8,296,944 B2
(45) Date of Patent: Oct. 30, 2012

(54) METHOD FOR MANUFACTURING A PRINTED CIRCUIT BOARD

(75) Inventors: Hung-Lin Chang, Taoyuan (TW); Chen-Chuan Chang, Taoyuan (TW)

(73) Assignee: Unimicron Technology Corp., Taoyuan, Taoyuan County (TW)

( * ) Notice: Subject to any disclaimer, the term of this patent is extended or adjusted under 35 U.S.C. 154(b) by 46 days.

(21) Appl. No.: 12/787,426

(22) Filed: May 26, 2010

(65) Prior Publication Data

US 2010/0299917 A1 Dec. 2, 2010

(30) Foreign Application Priority Data

Jun. 1, 2009 (TW) .............................. 98118050 A

(51) Int. Cl.
*H01K 3/10* (2006.01)
(52) U.S. Cl. ................. 29/852; 29/830; 29/840; 29/846
(58) Field of Classification Search .................... 29/825, 29/830, 832, 846, 852
See application file for complete search history.

(56) References Cited

U.S. PATENT DOCUMENTS

| 7,199,457 B2 * | 4/2007 | Ogawa ........................ 257/684 |
| 7,244,656 B2 * | 7/2007 | Ogawa ........................ 438/384 |
| 7,635,641 B2 * | 12/2009 | Hurwitz et al. ............... 438/612 |
| 7,868,464 B2 * | 1/2011 | Kawabata et al. ............ 257/778 |

* cited by examiner

*Primary Examiner* — Carl Arbes
(74) *Attorney, Agent, or Firm* — Alan Kamrath; Kamrath IP Lawfirm, PA

(57) ABSTRACT

A method for manufacturing a printed circuit board includes the steps of: providing a base board having a first surface layer; performing a first patterning process to the base board to form a bottom circuit on the first surface layer; forming a metal protection layer on the bottom circuit; performing a second patterning process to the metal protection layer to form a patterned metal protection layer; performing a build-up process to the base board to form a first built-up layer on the bottom circuit and the patterned metal protection layer; performing a third patterning process to the first built-up layer to form a first built-up layer circuit; performing a laser manufacturing process to the first built-up layer to form a cavity structure; and clearing the patterned metal protection layer.

19 Claims, 7 Drawing Sheets

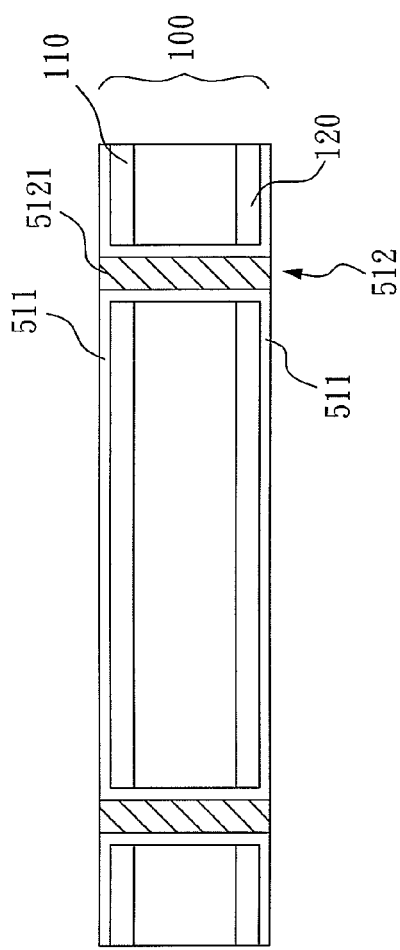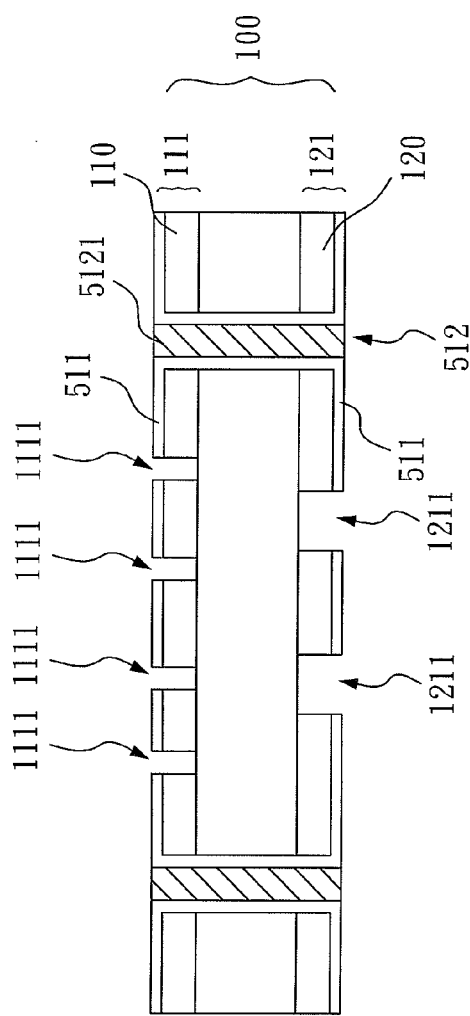

METHOD FOR MANUFACTURING A PRINTED CIRCUIT BOARD

BACKGROUND OF THE INVENTION

1. Field of the Invention

The present invention relates to a method for manufacturing a printed circuit board and, more particularly, to a manufacturing method using a metal protection layer to protect the circuit inside a cavity and other regions containing no circuit in the printed circuit board when using a laser manufacturing process to manufacture the cavity.

2. Description of the Related Art

In a current printed circuit board manufacturing process, lasers (such as carbon dioxide lasers, $CO_2$ lasers) are often used for processing like cutting or drilling. Compared with traditional machining, lasers can provide advantages such as high processing speed and high precision. Generally, in a printed circuit board, no circuit layout is implemented in a cavity thereof. Therefore, lasers can be used for forming a cavity in the printed circuit board. However, if it is necessary to implement a circuit layout in the cavity, regions containing no circuit in the cavity could be damaged due to the laser processing.

In a prior art technique, a protection mask film (PMF) is attached to the bottom layer of the region wherein the cavity is formed to protect the patterned circuit of the cavity. However, since the PMF is made of a polymer material and is not resistant to heat generated in the laser process, the PMF is likely to be damaged by the laser and so is the circuit around the cavity when the cavity is formed. Furthermore, it takes a lot of labor, time, and costs for workers to manually attach the PMF and to rip off the residual PMF after the cavity is formed.

Japanese Patent Application No. 10-22645 discloses a process for manufacturing a printed circuit board with a cavity. The process comprises forming a curable organic material or Teflon layer on the base board and then forming a patterned protection layer. However, the circuit pattern is formed by a traditional cutting process, with which it is difficult to achieve high precision. In addition, if a laser manufacturing process is used, problems arise in the organic layer which is still vulnerable to the high heat generated by the laser, and the circuit around the cavity could be damaged as well.

Therefore, it is necessary to provide a method for manufacturing a printed circuit board to solve the problems presented in the prior art techniques.

SUMMARY OF THE INVENTION

It is an object of the present invention to provide a method for manufacturing a printed circuit board in which a metal protection layer is used for protecting the circuit inside a cavity and other regions containing no circuit in the printed circuit board.

In order to achieve the above object, the present invention discloses a method for manufacturing a printed circuit board, comprising the steps of: providing a base board including a first surface layer; performing a first patterning process to the base board to form a bottom circuit on the first surface layer; forming a metal protection layer on the bottom circuit; performing a second patterning process to the metal protection layer to form a patterned metal protection layer; performing a built-up process to the base board to form a first built-up layer on the bottom circuit and the patterned metal protection layer; performing a third patterning process to the first built-up layer to form a first built-up layer circuit; performing a laser manufacturing process to the first built-up layer to form a cavity structure; and clearing the patterned metal protection layer.

In one embodiment of the present invention, the metal protection layer comprises a thickness of substantially between 1 μm to 10 μ. The metal protection layer comprises a compound layer, with the compound layer made of at least one or two materials selected from the group of gold, silver, copper, nickel, tin, titanium, and an alloy thereof.

BRIEF DESCRIPTION OF THE DRAWINGS

FIG. 2 to FIG. 13 illustrate views of the method for manufacturing a printed circuit board in an embodiment of the present invention

DETAILED DESCRIPTION OF THE PREFERRED EMBODIMENTS

The advantages and innovative features of the invention will become more apparent from the following detailed description when taken in conjunction with the accompanying drawings.

Figure 1:
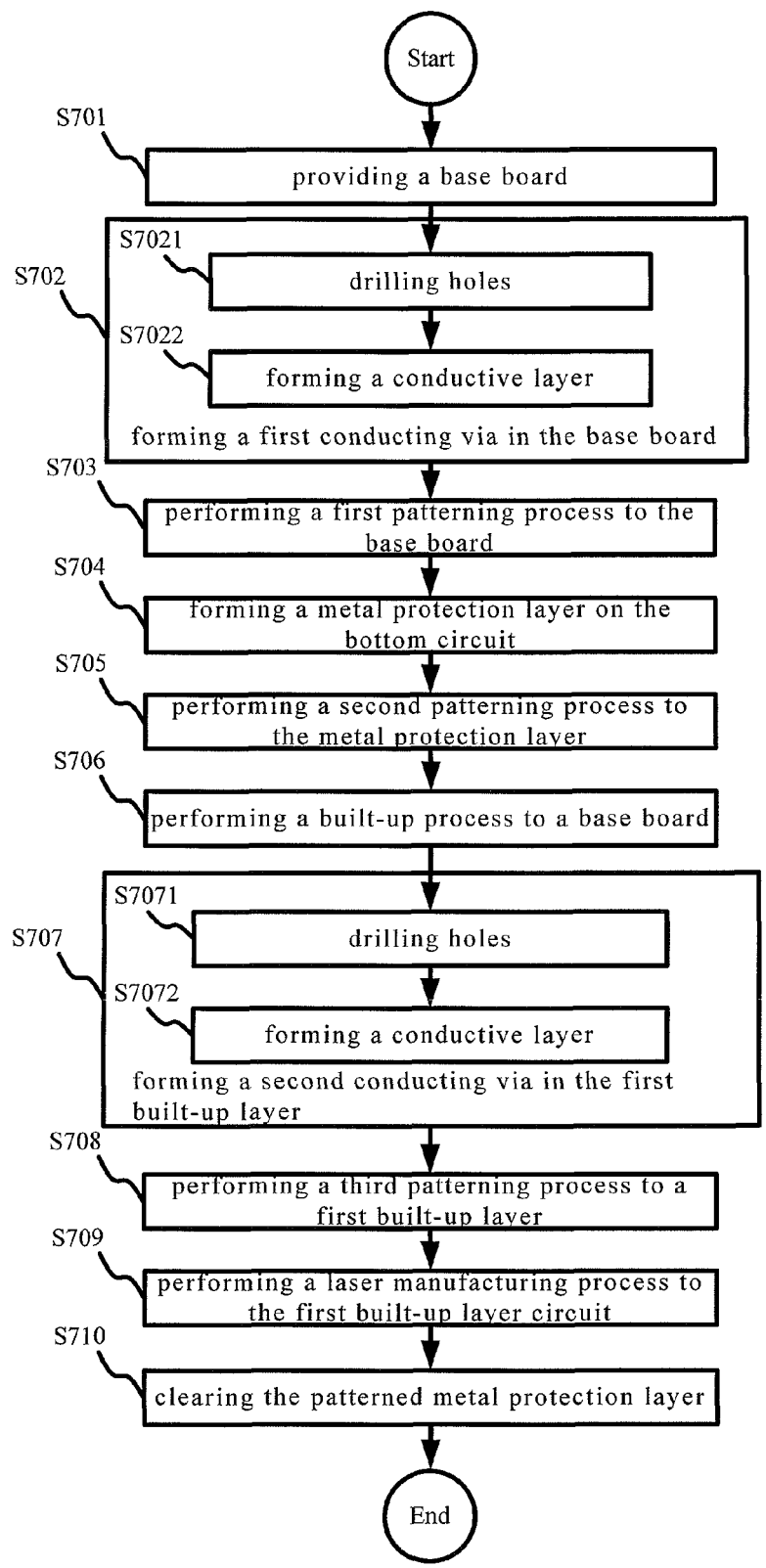
FIG. 1 illustrates a flowchart of a method for manufacturing a printed circuit board in an embodiment of the present invention.

Please refer to FIG. 1 for a flowchart of a method for manufacturing a printed circuit board in one embodiment of the present invention; and also to FIG. 2 to FIG. 13 for views of the method for manufacturing a printed circuit board in the embodiment. In this embodiment, the printed circuit board comprises a four-layer printed circuit board. However, the present invention can have other embodiments in which the printed circuit board has more than four layers. It is noted that the views illustrated in this disclosure are simplified figures, which are intended to briefly explain the method for manufacturing the printed circuit board in the present invention. Therefore, all the elements shown in the figures do not reflect the actual form of the elements, while the numbers, shapes, and sizes of the elements are merely illustrative and could be more complicated in an actual layout.

As shown in FIG. 1, the method first proceeds to S701: providing a base board.

Figure 2:
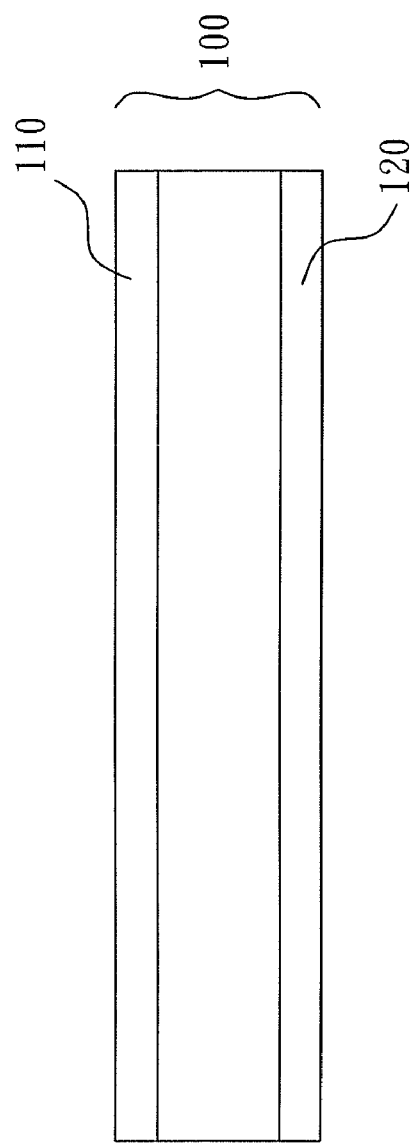

As shown in FIG. 2, in one embodiment of the present invention, the base board 100 is a two-layer core board. The base board 100 includes a first surface layer 110 and a second surface layer 120. The first surface layer 110 and the second surface layer 120 are respectively on the upper and lower sides of the base board 100. The first surface layer 110 and the second surface layer 120 can be copper layers but are not limited to copper layers. In an embodiment of the present invention, the base board 100 could be a two-layer or multi-layer printed circuit board which has a circuit layout disposed thereon (not shown in the figure).

Then, the method proceeds to step S702: forming a first conducting via in the base board.

In an embodiment of the present invention, the step S702 further includes step S7021 and step S7022.

Step S7021: drilling holes.

Figure 3:
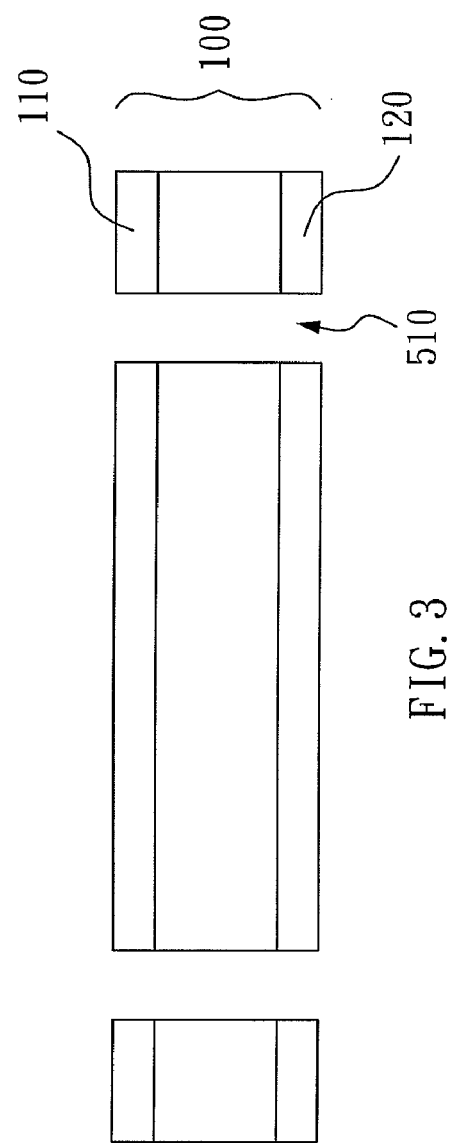

As shown in FIG. 3, in one embodiment of the present invention, the base board 100 is drilled to form two holes 510 penetrating through the base board 100. The drilling process can be done by a laser manufacturing process, an etching process, a machining process, or the like. The present invention can be done with other processing techniques and have another number of holes (not limited to two).

Step S7022: forming a conductive layer.

As shown in FIG. 4, in an embodiment of the present invention, a conductive layer 511 can be formed on the inner walls of the first surface layer 110, the second surface layer 120, and the holes 510, such that the hole 510 forms a first conducting via 512 electrically connecting the first surface layer 110 and the second surface layer 120. The conductive layer 511 is formed by electroless plating, electroplating, or other processes. In an embodiment of the present invention, after the conductive layer 511 is formed, the first conducting via 512 is filled by, but is not limited to being filled by, electroplating, or is filled with a via filler 5121. For example, the first conducting via 512 can also be filled by silver paste or copper paste.

Then, the method proceeds to Step S703: performing a first patterning process to the base board.

As shown in FIG. 5, in an embodiment of the present invention, a first patterning process is performed to the base board 100 such that the first surface layer 110 and a part of the conductive layer 511 corresponding to the first surface layer 110 form a bottom circuit 111 and such that the second surface layer 120 and a part of conductive layer 511 corresponding to the second surface layer 120 forms a second surface layer circuit 121. The patterning process comprises the steps of surface cleaning, photoresist coating, exposing, developing, etching, and photoresist stripping. Since the patterning process is known in the art, it will not be further described for the sake of brevity. In one embodiment of the present invention, the bottom circuit 111 comprises a plurality of grooves 1111, and the second surface layer circuit 121 comprises a plurality of grooves 1211.

Then, the method proceeds to S704: forming a metal protection layer on the bottom circuit.

Figure 6:
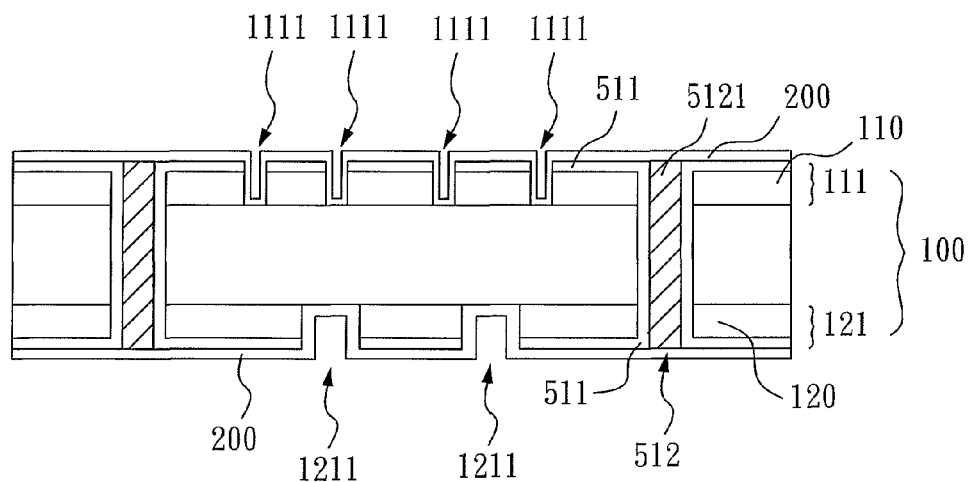

As shown in FIG. 6, in one embodiment of the present invention, a metal protection layer 200 is formed on the conductive layer 511, grooves 1111 of the bottom circuit 111 and grooves 1211 of the second surface layer circuit 121. The step of forming the metal protection layer 200 is implemented by, but is not limited to being limited by, a chemical vapor deposition(CVD) process, a physical vapor deposition (PVD) process, a sputtering process, or an electroless plating process. In one embodiment of the present invention, the metal protection layer 200 has a thickness of substantially between 0.075 μm to 10 μm. However, the metal protection layer 200 can have other thicknesses. In a preferred embodiment of the present invention, the metal protection layer 200 has a thickness of substantially between 3 μm to 5 μm. In an embodiment of the present invention, the metal protection layer 200 is also formed on the conductive layer 511.

In an embodiment of the present invention, the metal protection layer 200 comprises a compound layer made of at least one or two materials selected from the group of gold, silver, copper, nickel, tin, titanium, and an alloy thereof. For example, the compound layer can be, but is not limited to, a nickel/gold layer. In a preferred embodiment of the present invention, the metal protection layer 200 consists of gold or copper. In another embodiment of the present invention, the metal protection layer 200 can be a stainless steel layer or a conductive polymer layer.

The method proceeds to Step S705: performing a second patterning process to the metal protection layer.

Figure 7:
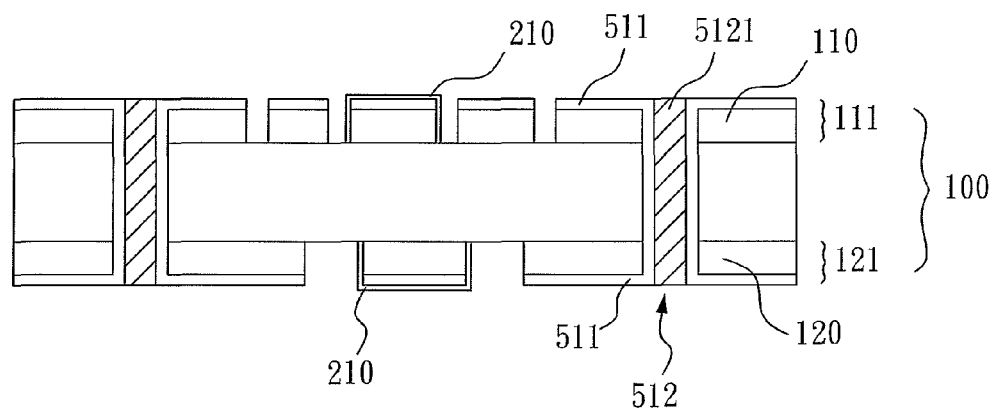

As shown in FIG. 7, in one embodiment of the present invention, a second patterning process is performed to the metal protection layer 200 such that the metal protection layer 200 forms a patterned metal protection layer 210. In one embodiment of the present invention, the patterned metal protection layer 210 is disposed to protect the circuit around the cavity. The patterning process comprises the steps of surface cleaning, photoresist coating, exposing, developing, and photoresist stripping. Since the patterning process is known in the art, it will not be further described for the sake of brevity.

Then, the method proceeds to Step S706: performing a build-up process to a base board.

Figure 8:
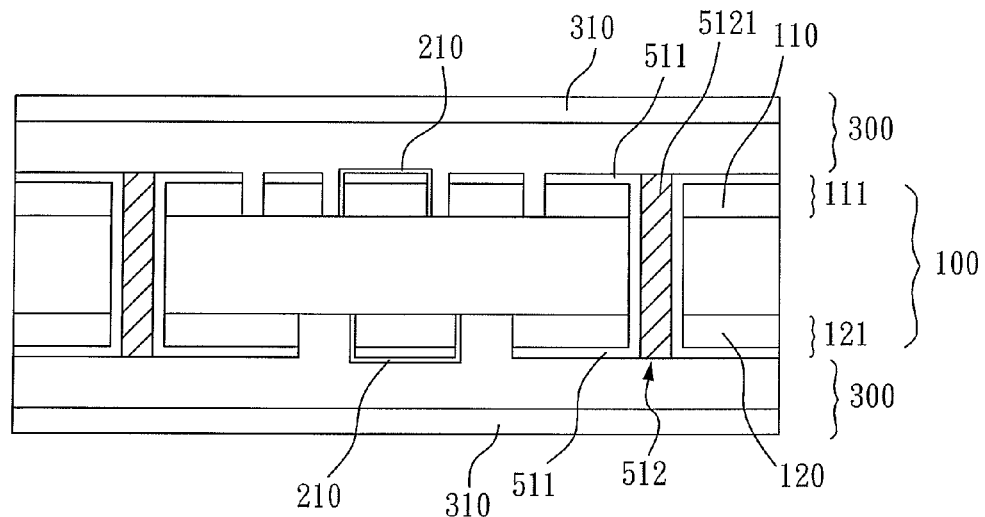

As shown in FIG. 8, in one embodiment of the present invention, a build-up process is performed to the base board 100 to form a first built-up layer 300 on the bottom circuit 111 and the patterned metal protection layer 210. The first built-up layer 300 comprises a third surface layer 310 which can be, but is not limited to, a copper layer. For example, the build-up process is also performed to the second surface layer circuit 121. Since the built-up process is provided for manufacturing a multilayer printed circuit board and is known in the art, it will not be further described for the sake of brevity.

Then, the method proceeds to Step S707: forming a second conducting via in the first built-up layer.

In an embodiment of the present invention, the step S707 further includes step S7071 and step S7072.

Step S7071: drilling holes.

Figure 9:
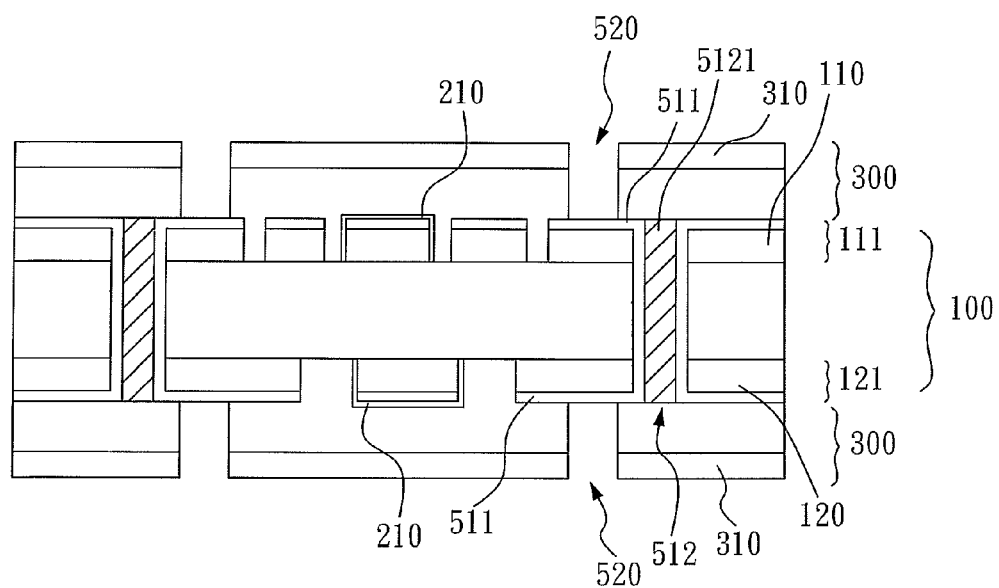

As shown in FIG. 9, in one embodiment of the present invention, the first built-up layer 300 is drilled to form four holes 520 penetrating through the first built-up layer 300. The drilling process can be done by a laser manufacturing process, an etching process, a machining process, or the like. The present invention can be done with other processing techniques.

Step S7072: forming a conductive layer.

Figure 10:
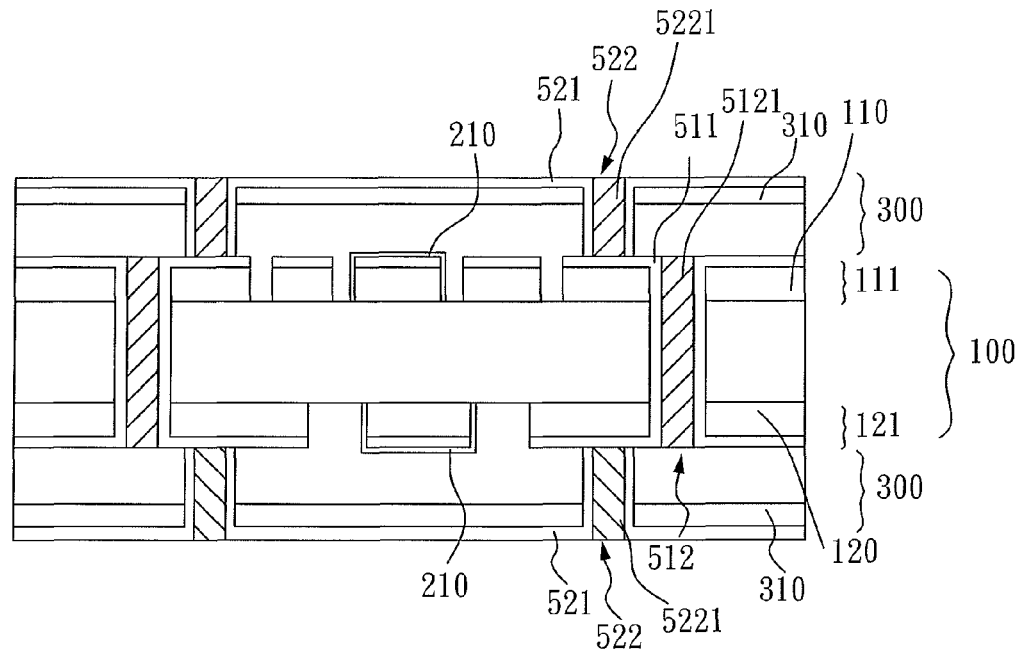

As shown in FIG. 10, in an embodiment of the present invention, a conductive layer 521 can be formed on the inner walls of the holes 520 such that the holes 520 form a second conducting via 522 electrically connecting the upper side and the lower side of the first built-up layer 300. The conductive layer 511 is formed by electroless plating, electroplating, or other processes. In one embodiment of the present invention, after the conductive layer 521 is formed, the second conducting via 522 is filled by, but is not limited to being filled by, electroplating, or is filled with the via filler 5221.

Then the method proceeds to Step S708: performing a third patterning process to a first built-up layer.

Figure 11:
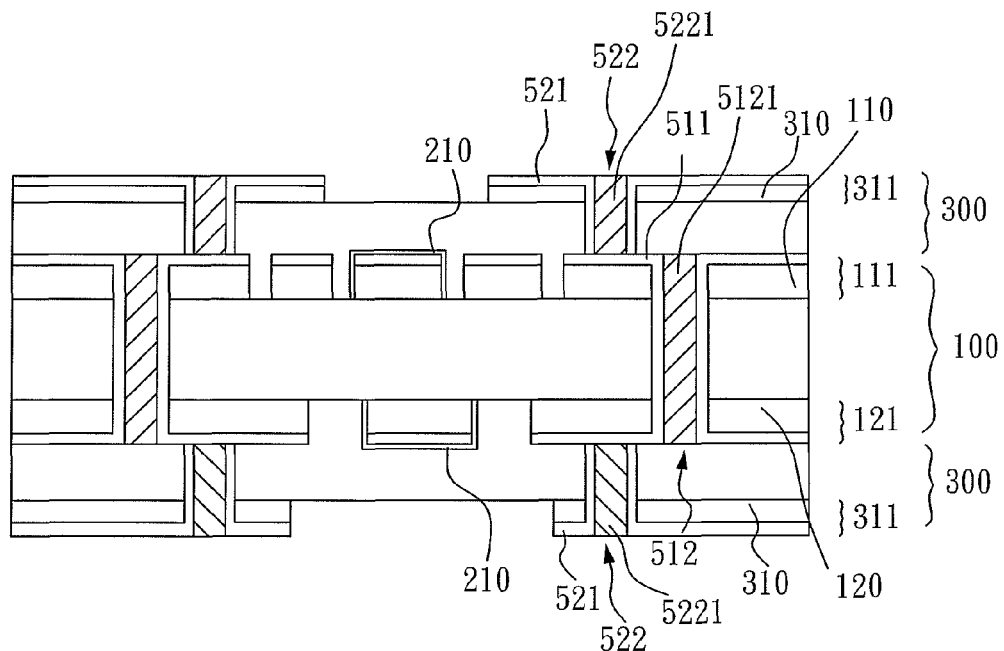

As shown in FIG. 11, in one embodiment of the present invention, a third patterning process is performed to a first built-up layer 300 such that the third surface layer 310 and a part of the conductive layer 521 corresponding to the third surface layer 310 form a first built-up layer circuit 311.

Then, the method proceeds to Step S709: performing a laser manufacturing process to the first built-up layer.

Figure 12:
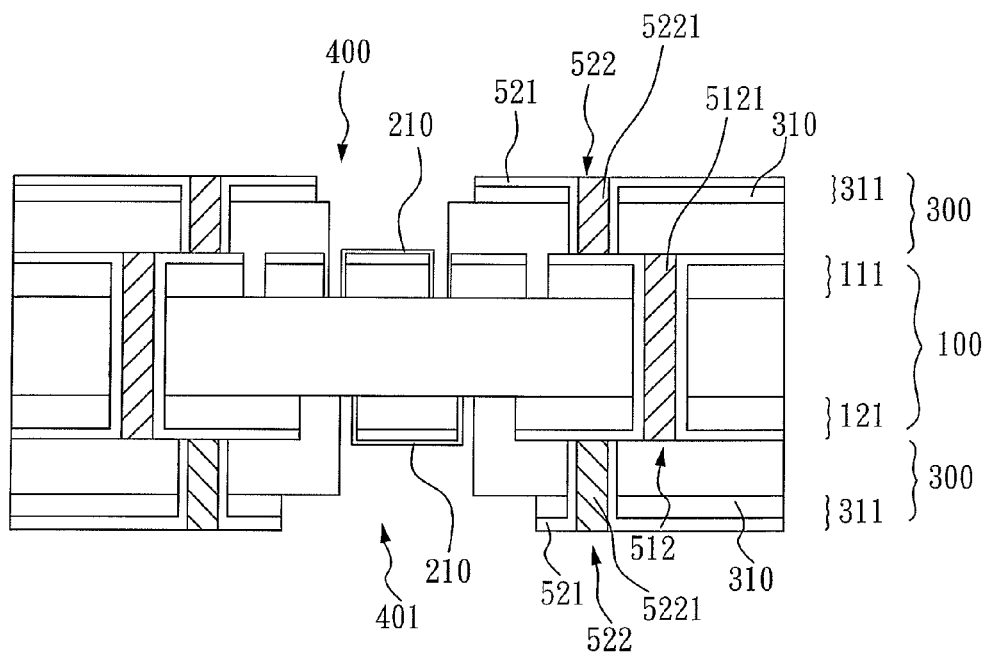

As shown in FIG. 12, in one embodiment of the present invention, a laser manufacturing process is performed to the first built-up layer circuit 311 to form cavity structures 400, 401. In an embodiment of the present invention, the laser manufacturing process uses a carbon dioxide ($CO_2$) laser, an ultraviolet (UV) laser, or the like. It is noted that during performance of the laser manufacturing process to the first built-up layer circuit 311, the cavity structures 400, 401 can have various depths and widths. Therefore, the cavity structures are not limited to certain depths or widths.

Finally, in step S710: clearing the patterned metal protection layer.

Figure 13:
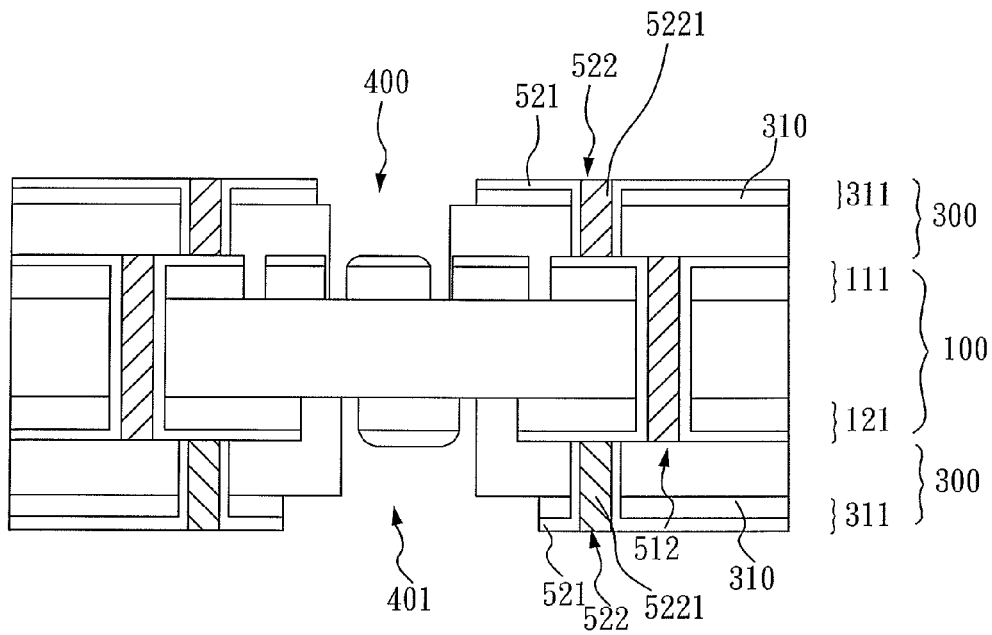

As shown in FIG. 13, the patterned metal protection layer 210 is cleared by using an etching process or a flash etching process. Since the patterned metal protection layer 210 has a thickness substantially between 1 μm to 10 μm, the time required for the etching process is short and causes no damage to other circuits. Furthermore, the bottom circuit 111 and the second surface layer circuit 121 disposed in the cavity structure 400, 401 have a top end formed in an arc shape after the metal protection layers 210 are removed.

It is noted that the above-mentioned embodiments are only for illustration. It is intended that the present invention cover modifications and variations of this invention provided they fall within the scope of the following claims and their equivalents. Therefore, it will be apparent to those skilled in the art that various modifications and variations can be made to the structure of the present invention without departing from the scope or spirit of the invention.

What is claimed is:

1. A method for manufacturing a printed circuit board, comprising:
   providing a base board including a bottom circuit;
   forming a metal protection layer on the bottom circuit;
   making the metal protection forming to a patterned metal protection layer;
   forming a first built-up layer on the bottom circuit and the patterned metal protection layer;
   making the first built-up layer forming to a first built-up layer circuit; and
   making the first built-up layer circuit to form a cavity structure comprising a part of the bottom circuit, wherein the cavity structure is substantially in an arc shape.

2. The method for manufacturing a printed circuit board as claimed in claim 1, wherein the metal protection layer comprises a thickness of substantially between 1 µm to 10 µm.

3. The method for manufacturing a printed circuit board as claimed in claim 1, wherein the metal protection layer comprises a compound layer, wherein the compound layer is made of at least one or two materials selected from the group of gold, silver, copper, nickel, tin, titanium, and an alloy thereof.

4. The method for manufacturing a printed circuit board as claimed in claim 1, wherein the metal protection layer comprises a stainless steel layer or a conductive polymer layer.

5. A method for manufacturing a printed circuit board, comprising:
   providing a base board including a first surface layer;
   performing a first patterning process to the base board to form a bottom circuit on the first surface layer;
   forming a metal protection layer on the bottom circuit;
   performing a second patterning process to the metal protection layer to form a patterned metal protection layer;
   performing a build-up process to the base board to form a first built-up layer on the bottom circuit and the patterned metal protection layer;
   performing a third patterning process to the first built-up layer to form a first built-up layer circuit;
   performing a laser manufacturing process to the first built-up layer to form a cavity structure with the bottom circuit disposal therein, wherein the bottom circuit has a top end formed in an arc shape; and
   clearing the patterned metal protection layer.

6. The method for manufacturing a printed circuit board as claimed in claim 5, wherein the metal protection layer comprises a thickness of substantially between 1 µm to 10 µm.

7. The method for manufacturing a printed circuit board as claimed in claim 5, wherein the metal protection layer comprises a compound layer, wherein the compound layer is made of at least one or two materials selected from the group of gold, silver, copper, nickel, tin, titanium, and an alloy thereof.

8. The method for manufacturing a printed circuit board as claimed in claim 5, wherein the metal protection layer comprises a stainless steel layer or a conductive polymer layer.

9. The method for manufacturing a printed circuit board as claimed in claim 5, wherein the base board comprises a core board or a multilayer printed circuit board.

10. The method for manufacturing a printed circuit board as claimed in claim 5, wherein forming the metal protection layer on the bottom circuit is implemented by a chemical vapor deposition (CVD) process, a physical vapor deposition (PVD) process, a sputtering process, or an electroless plating process.

11. The method for manufacturing a printed circuit board as claimed in claim 5, wherein the base board further comprises a second surface layer, and wherein performing the first patterning process to the base board further comprises forming a second surface layer circuit on the second surface layer.

12. The method for manufacturing a printed circuit board as claimed in claim 5, wherein the first surface layer and the second surface layer comprise a copper layer respectively.

13. The method for manufacturing a printed circuit board as claimed in claim 5 further comprising:
   forming at least a first conducting via in the base board.

14. The method for manufacturing a printed circuit board as claimed in claim 13, wherein forming at least the first conducting via in the base board is implemented by the laser manufacturing process or an etching process.

15. The method for manufacturing a printed circuit board as claimed in claim 13 further comprising: forming at least a second conducting via in the first built-up layer.

16. The method for manufacturing a printed circuit board as claimed in claim 15, wherein forming at least the second conducting via in the first built-up layer is implemented by the laser manufacturing process or an etching process.

17. The method for manufacturing a printed circuit board as claimed in claim 5, wherein the laser manufacturing process uses a carbon dioxide ($CO_2$) laser or an ultraviolet (UV) laser.

18. The method for manufacturing a printed circuit board as claimed in claim 5, wherein clearing the patterned metal protection layer is implemented by using an etching process or a flash etching process.

19. The method for manufacturing a printed circuit board as claimed in claim 5, wherein the metal protection layer comprises a thickness of substantially between 1 µm to 10 µm.

* * * * *